US009153915B2

(12) United States Patent
Suzuki et al.

(10) Patent No.: US 9,153,915 B2
(45) Date of Patent: Oct. 6, 2015

(54) CONNECTOR

(71) Applicants: Hirokazu Suzuki, Yamato (JP); Toshihiro Niitsu, Machida (JP); Osamu Matsuzaka, Yamato (JP); Hiroshi Ueno, Yamato (JP)

(72) Inventors: Hirokazu Suzuki, Yamato (JP); Toshihiro Niitsu, Machida (JP); Osamu Matsuzaka, Yamato (JP); Hiroshi Ueno, Yamato (JP)

(73) Assignee: Molex, LLC, Lisle, IL (US)

( * ) Notice: Subject to any disclaimer, the term of this patent is extended or adjusted under 35 U.S.C. 154(b) by 248 days.

(21) Appl. No.: 13/659,331

(22) Filed: Oct. 24, 2012

(65) Prior Publication Data

US 2013/0102184 A1 Apr. 25, 2013

(30) Foreign Application Priority Data

Oct. 24, 2011 (JP) ................................ 2011-232820

(51) Int. Cl.

*H01R 3/00* (2006.01)
*H01L 41/00* (2013.01)
*H01H 27/00* (2006.01)
*H01R 13/703* (2006.01)
*H01R 12/71* (2011.01)
*H01R 12/73* (2011.01)

(52) U.S. Cl.

CPC ............. *H01R 13/703* (2013.01); *H01H 27/00* (2013.01); *H01L 41/00* (2013.01); *H01R 3/00* (2013.01); *H01R 12/712* (2013.01); *H01R 12/73* (2013.01)

(58) Field of Classification Search

USPC .................... 439/489, 188, 189, 374, 620.24; 310/319, 338, 339, 330–332, 327, 342, 310/35, 357, 367, 311, 318, 323.06; 200/43.06, 40.05, 511 R, 51.12, 56 R, 200/442, 512, 270, 272

See application file for complete search history.

(56) References Cited

U.S. PATENT DOCUMENTS

| | | | | |
|---|---|---|---|---|
| 5,775,936 | A | 7/1998 | Tsuji | |
| 5,904,581 | A | 5/1999 | Pope et al. | |
| 6,045,395 | A | 4/2000 | Saito et al. | |
| 6,619,965 | B1 | 9/2003 | Kihira et al. | |
| 7,591,668 | B2 * | 9/2009 | Nakamura | 439/489 |
| 8,093,783 | B2 * | 1/2012 | Rosenthal et al. | 310/328 |
| 8,193,685 | B2 * | 6/2012 | Klee et al. | 310/344 |
| 2007/0032113 | A1 | 2/2007 | Takagi | |
| 2009/0107009 | A1 | 4/2009 | Bishop et al. | |

FOREIGN PATENT DOCUMENTS

| | | | |
|---|---|---|---|
| CN | 2687877 | Y | 3/2005 |
| CN | 1614824 | A | 5/2005 |
| CN | 201138719 | Y | 10/2008 |
| CN | 201369883 | Y | 12/2009 |
| JP | 04-132180 | A | 5/1992 |
| JP | 06-310210 | A | 11/1994 |
| JP | 2007-134169 | A | 5/2007 |
| JP | 2007-149517 | A | 6/2007 |
| JP | 2009-037836 | A | 2/2009 |
| JP | 201279567 | * | 10/2010 |
| TW | M275552 | | 9/2005 |

* cited by examiner

*Primary Examiner* — Abdullah Riyami
*Assistant Examiner* — Harshad Patel

(57) ABSTRACT

Provided is a connector including a first connector having a first terminal and a first mating guide portion, and a second connector having a second terminal engaging the first terminal and a second mating guide portion fitted with the first mating guide portion, in which the first mating guide portion includes a fixed terminal for detecting the mating of the first connector and the second connector, the second mating guide portion includes a resilient terminal for detecting the mating of the first connector and the second connector, and the fixed terminal or the resilient terminal has a piezoelectric electric element.

16 Claims, 13 Drawing Sheets

CONNECTOR

REFERENCE TO RELATED APPLICATIONS

The Present Disclosure claims priority to prior-filed Japanese Patent Application No. 2011-232820, entitled "Connector," filed on 24 Oct. 2011 with the Japanese Patent Office. The content of the aforementioned Patent Application is incorporated in its entirety herein.

BACKGROUND OF THE PRESENT DISCLOSURE

The Present Disclosure relates, generally, to a connector, and, more particularly, to a board-to-board connector that detects the mating of a first connector and a second connector, and prevents incomplete mating, even when the mating process is for a compact and low-profile connector, by arranging a piezoelectric element for detecting the state of a fixed terminal and elastic terminal when the first connector and the second connector are mated.

In order to electrically connect a pair of parallel boards to each other, connectors such as board-to-board connectors are used. Such connectors are provided on opposing surfaces of a pair of boards such as circuit boards, and are then mated with each other to establish an electrical connection. Reinforcing metal fittings attached to both ends function as locking members to hold the opposing connector in a mated state.

However, the bottom surface of each connector is mounted on a board which is much larger than the connector, and it can be difficult to visually confirm whether two connectors are mated. In recent years, connectors have become even more compact and have a lower profile. These connectors are interposed inside a very narrow space between opposing boards, which makes it even more difficult to determine whether two connectors have been mated properly.

A technique has been proposed to detect whether connectors have been mated properly using a sensor rather than visual confirmation by the operator performing the mating operation. One example is disclosed in Japanese Patent Application No. 5-8880, the content of which is incorporated herein in its entirety.

FIG. 13 is a diagram used to explain a conventional board-to-board connector able to detect mating. In FIG. 13, 861 is a plug terminal serving as a terminal for a plug which is one of the connectors, and 961 is a receptacle terminal serving as a terminal for a receptacle which is the other connector. When both connectors are mated, as shown in the drawing, the plug terminal 861 is screwed into the receptacle terminal 961. A piezoelectric element 893 is arranged near the receptacle terminal 961, and the tip of the plug terminal 861 applies pressure to the piezoelectric element 893 when the plug terminal 861 is screwed into the receptacle terminal 961. When the plug terminal 861 applies pressure, the piezoelectric element 893 generates voltage V corresponding to the pressing force. A detection device 897 detects the value of the voltage V, and a light-emitting element 898 emits light when the value of the voltage V is a predetermined value indicating that mating of both connectors has been completed.

However, the plug terminal 861 has to be screwed into the receptacle terminal 961 in conventional connectors, and the connectors are large. Therefore, this technique is difficult to use inside the case of a small electronic device such as a cellphone, personal digital assistant (PDA), or digital camera. Also, because the complete mating of connectors is detected based on the amount of pressing force received by a piezoelectric element 893 when a plug terminal 861 is screwed in, detection accuracy is difficult to achieve.

SUMMARY OF THE PRESENT DISCLOSURE

The purpose of the Present Disclosure is to solve the problem associated with conventional connectors by providing a reliable board-to-board connector able to properly detect the mating of a first connector and a second connector, and to reliably prevent incomplete mating in a mating process, even when the mating process is for a compact and low-profile connector, by arranging a piezoelectric element for detecting the state of a fixed terminal and elastic terminal when the first connector and the second connector are mated.

In an aspect of the Present Disclosure, a connector is provided including a first connector having a first terminal and a first mating guide portion, and a second connector having a second terminal engaging the first terminal and a second mating guide portion fitted with the first mating guide portion. The first mating guide portion includes a fixed terminal for detecting the mating of the first connector and the second connector. The second mating guide portion includes a resilient terminal for detecting the mating of the first connector and the second connector. The fixed terminal or the resilient terminal has a piezoelectric electric element.

Another aspect of the Present Disclosure is a connector, in which one of the fixed terminal and the resilient terminal includes an engaging protrusion, and the other includes an engaging recess and a ride-over portion projecting from the engaging recess. The first mating guide portion and the second mating guide portion move relative to each other. The engaging protrusion rides up over the ride-over portion and engages the engaging recess when the first connector and the second connector are mated.

Still another aspect of the Present Disclosure is a connector in which the piezoelectric element is arranged on a deforming surface of the resilient terminal, and voltage is generated as the surface is deformed. Still another aspect of the Present Disclosure is a connector in which the piezoelectric element is arranged on a surface of the fixed terminal contacted by the resilient terminal, and voltage is generated as pressure is applied by the resilient terminal.

Still another aspect of the Present Disclosure is a connector in which a pair of electrodes is connected to the piezoelectric element, a change in voltage between the pair of electrodes is detected by a detection electrode without making contact, and completion of the mating of the first connector and the second connector is detected. Still another aspect of the Present Disclosure is a connector in which a pair of electrodes is connected to the piezoelectric element, and a change in color by a color-changing member consisting of an electrochromic material connected electrically to the pair of electrodes is used to detect the completion of the mating of the first connector and the second connector.

Still another aspect of the Present Disclosure is a connector in which the completion of the mating of the first connector and the second connector is detected by detecting a first peak included in a change in voltage, and a second peak having the reverse polarity of the first peak. A final aspect of the Present Disclosure is a connector in which the first connector includes a plate-like first conductor, the first terminal being a member projecting from a surface of the first conductor. The second connector includes a plate-like second conductor, the second terminal being a plate-like member formed by patterning the second conductor. An inner opening is formed on the inside thereof and a pair of contact arms oppose each other and resiliently pinch the first terminal from both sides when the first terminal and the second terminal are engaged.

The connector of the Present Disclosure has a piezoelectric element for detecting the state of a fixed terminal and elastic terminal when the first connector and the second connector are mated. Thus, a reliable connector can be provided which is able to properly detect the mating of a first connector and a second connector, and to reliably prevent incomplete mating in a mating process, even when the mating process is for a compact and low-profile connector.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

With reference to the Figures, a male connector 1 is connected electrically to a female connector 101. The male connector 1 is mounted on a surface of a first board 91 serving as a mounting member, and the female connector 101 is mounted on a surface of a second board 191 serving as a mounting member. The male connector 1 and the female connector 101 may be made separately from the first board 91 and the second board 191 and then mounted on the surface of the first board 91 and the second board 191, or they may be made directly on the surface of the first board 91 and the second board 191.

Figure 2:
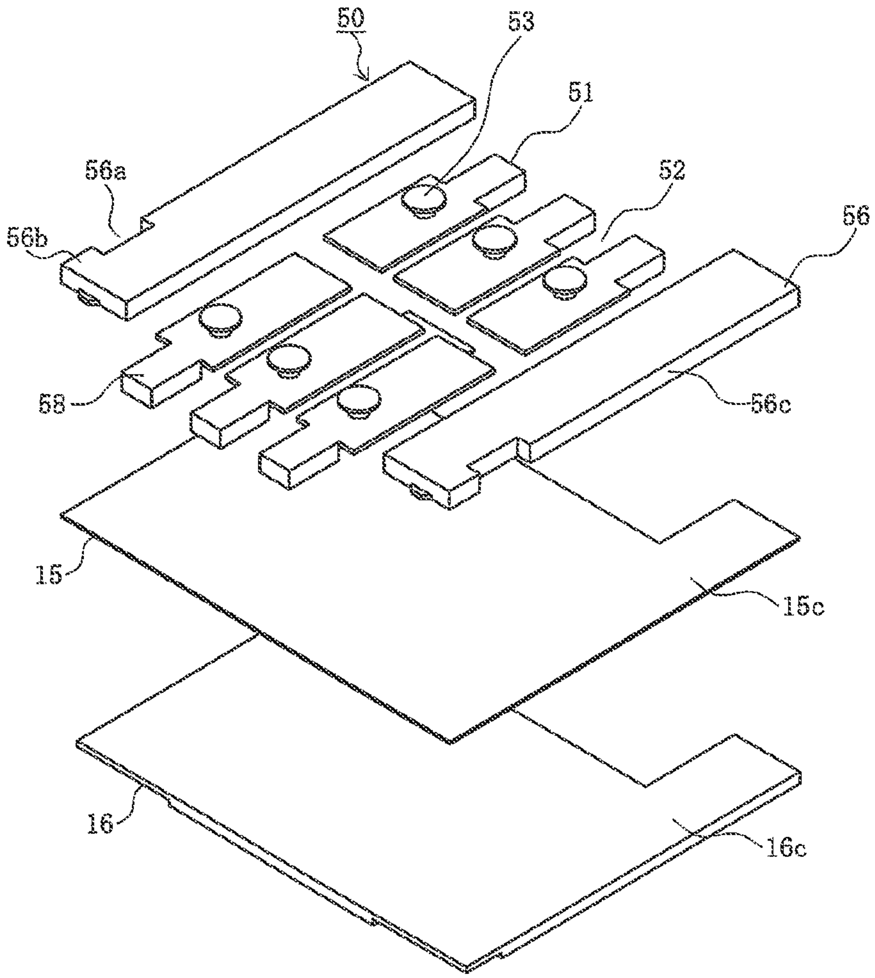
FIG. 2 is an exploded view of the layer structure of the male connector of FIG. 1.

The male connector 1 is a plate-like, low-profile connector with a substantially rectangular shape. As shown in FIG. 2, the male connector 1 has, from the mounting surface (the bottom surface in FIG. 2), a sheet-like reinforcing layer 16, a base film 15 (that is, an insulative flat, plate-like member), and a conductive pattern 50. The reinforcing layer 16 is arranged on the other surface of the base film 15 (the bottom surface in FIG. 2). Both ends of the base film 15 in the width direction function as base film end portions 15*c* extending longitudinally. Similarly, both ends of the reinforcing layer 16 in the width direction function as reinforcing layer end portions 16*c* extending longitudinally.

The conductive pattern 50 is applied beforehand to one surface of the base film 15, and extends in the longitudinal direction of the male connector 1 (the direction connecting the upper right to the upper left in FIG. 2). Additionally, the conductive pattern 50 includes a plurality of male conductors 51 serving as first conductors and functioning as a plurality of conductive wires arranged in parallel, and male reinforcing metal fittings 56 functioning as a first mating guide unit and serving as first reinforcing metal fittings arranged at both ends of the male conductors 51. The male conductors 51 are thin, flat rectangular pads separated by male reinforcing metal fittings 56. Adjacent male conductors 51 are separated by a pattern-separating space 52.

Each male conductor 51 is exposed on the mating surface with the male connector 1, and has a single protruding terminal 53 serving as the first terminal or male terminal. In the example shown, there is a plurality of male conductors 51 and protruding terminals 53 arranged in parallel at a predetermined pitch, so as to form two columns extending in the width direction of the male connector 1. Further, each protruding terminal 53 is a member protruding from the surface of a male conductor 51, and can, for example, be integrally formed with the male conductor 51 using an etching method employed in a photolithography technique. As shown, the protruding terminals 53 are formed so that the diameter of the tip portion is greater than that of the other portions.

Each male conductor 51 has a tail portion 58 extending forward and backward from the front end and rear end of the base film 15. The mounting surface of the tail portion 58 is exposed to the mounting surface of the male connector 1, and is connected by solder to a connection pad (not shown) formed on the surface of the first board 91. In this way, the male connector 1 is secured to the first board 91, and the male conductors 51 are connected electrically to the corresponding conductive traces on the first board 91.

Also, male reinforcing metal fittings 56 functioning as engaging protrusions or first mating guide portions are arranged on either side of the male conductors 51. The male reinforcing metal fittings 56 are applied beforehand to one surface of the base film 15, extend in the longitudinal direction of the male connector 1, and are arranged at both ends of the male connectors 1 in the width direction, separated by the male conductors 51.

The side edges 56*c* of the male reinforcing metal fittings 56 function as a fixed terminal or mating detection terminal for detecting whether the mating of the male connector 1 to the female connector 101 has been completed. Engaging arms 157 on the female connector 101 function as resilient terminals or the mating detection terminals on the other end. The side edges 56*c* of the male reinforcing metal fittings 56 are formed to align with the side edges of the male connector 1, and an engaging recess 56*a* recessed towards the inside in the width direction is formed in a portion near the front end (the lower left end in FIG. 2). These engaging recesses 56*a* engage the engaging protrusions 157*a* on the engaging arms 157 of the female connector 101, and prevent the male connector 1 and the female connector 101 from becoming disengaged. Also, a ride-over portion 56*b* protruding relative to the engaging recess 56*a* is formed in a position further forward from the engagement recess 56*a* on the side edge 56*c* of the male metal fitting 56.

The base film end portions 15*c* of the base film 15 are arranged along the entire mounting surface side of the male reinforcing metal fittings 56. As a result, the mounting surface of male reinforcing metal fittings 56 is not exposed to the mounting surface of the male connector 1. The male reinforcing metal fittings 56 are inserted into and mated with the engaging recesses 156 functioning as the second mating guide units in the female connector 101 in order to position the male connector 1 and the female connector 101.

Figure 3:
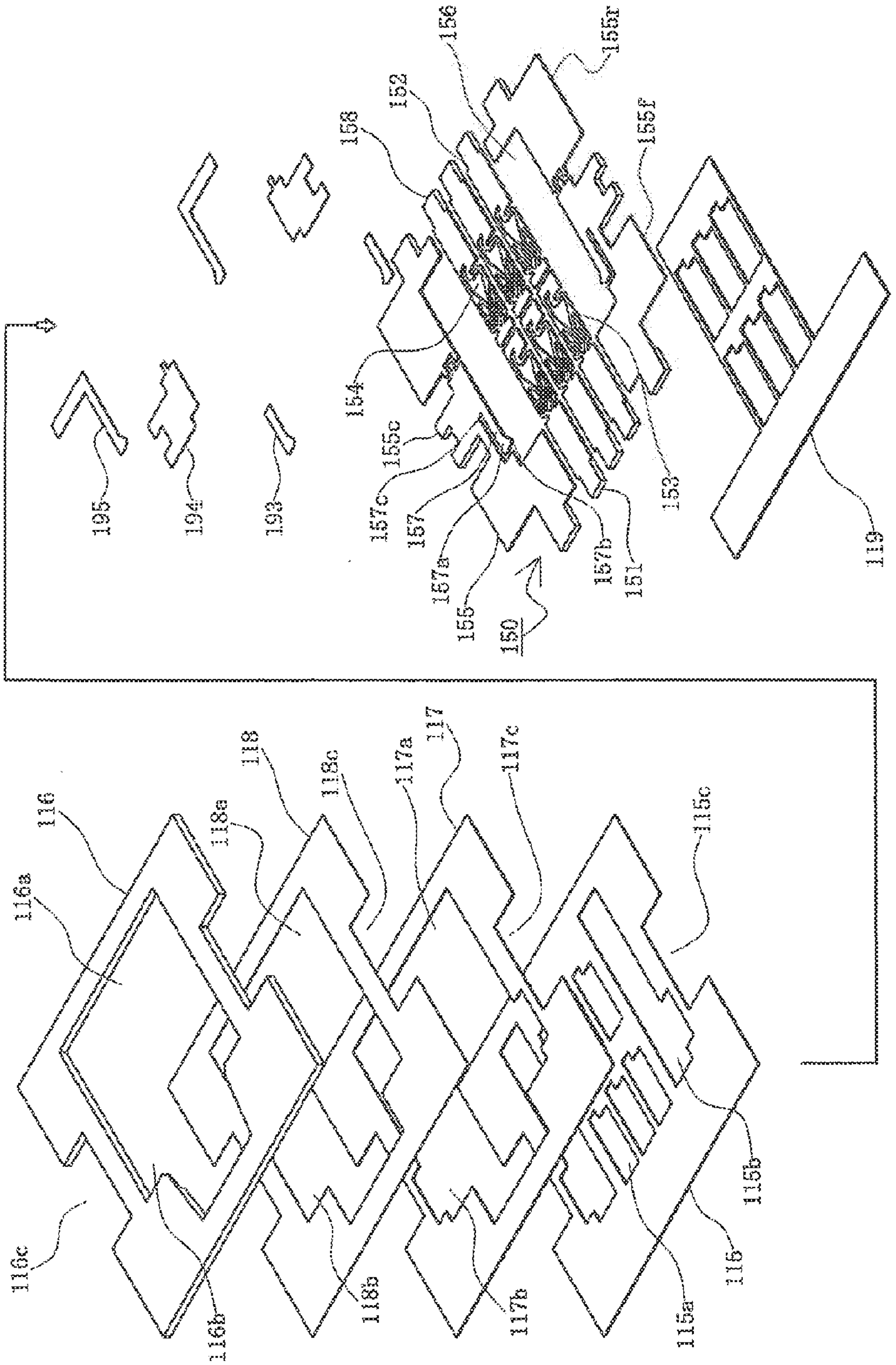
FIG. 3 is an exploded view of the layer structure of the female connector of FIG. 1.

As illustrated, the female connector 101 is a plate-like, low-profile connector with a substantially rectangular shape. As shown in FIG. 3, the female connector 101 is a plate-like member having a layer structure in which the following components are laminated in sequential order from the mounting surface side (the bottom surface in FIG. 3): a reinforcing layer 119, a base film 115, a conductive pattern 150, a cover film 117, an adhesive layer 118 and a reinforcing frame layer 116.

The conductive pattern 150 is applied beforehand to one surface of the base film 115, extends in the longitudinal direction of the female connector 101 (the direction connecting the upper right to the upper left in FIG. 3), and has a plurality of female conductors 151 serving as second conductors and functioning as a plurality of conductive wires arranged in parallel, and female reinforcing metal fittings 155 functioning as a second mating guide unit and serving as a pair of second reinforcing metal fittings arranged at both ends of the female conductors 151. The female conductors 151 are thin, flat rectangular pads separated by female reinforcing metal fittings 155. Adjacent female conductors 151 are separated by a pattern-separating space 152. Each female conductor 151 has a single receiving terminal 153 serving as the second terminal or female terminal formed in a portion exposed to the mating surface of the female connector 101.

Each receiving terminal 153 is a member accommodated inside a terminal accommodating opening 154 in the thickness direction of the female conductors 151 and can, for example, be integrally formed with the female conductor 151. Typically, the patterns remaining after patterning of the female conductors 151 are the receiving terminals 153, and the portions in which the material surrounding the receiving terminals 153 has been removed are the terminal accommodating holes 154. Therefore, the thickness dimension of the receiving terminals 153 is the same as the thickness dimension of the female conductors 151. Additionally, each receiving terminal 153 has a pair of contact arms 153*a* whose base is connected to the peripheral edge of the terminal accommodating holes 154; that is, to the portion of the female conductors 151 surrounding the receiving terminals 153. These contact arms 153*a* have spring action and are resiliently deformed in the width direction of the female connector 101.

A terminal accommodating opening 154 includes an inner opening 154*a* on the inside of a receiving terminal 153 and an outer opening 154*b* on the outside of a receiving terminal 153. When a receiving terminal 153 is mated with a protruding terminal 53 on a male connector 1, the inner opening 154*a* receives and accommodates the protruding terminal 53. The outer opening 154*b* allows for deformation of the contact arms 153*a*.

The inner opening 154*a* has a large area. Typically, the width dimension is greater than the width dimension of the tip portion of the protruding terminal 53, and the dimension in the vertical direction is greater than the dimension in the vertical direction of the tip portion of the protruding terminal 53. As a result, the protruding terminal 53 can be smoothly introduced to the inner opening 154*a*. Also, the interval between an opposing pair of contact arms 153*a* is a space with a narrow width. Typically, the width dimension is smaller than the width dimension of the protruding terminal 53. As a result, when there is relative movement of a protruding terminal 53 accommodated inside the inner opening 154*a* in the interval between an opposing pair of contact arms 153*a*, the opposing pair of contact arms 153*a* come into contact with the sides of the protruding terminal 53 and are pushed apart. The spring action of the contact arms 153*a* then causes the opposing pair of contact arms 153*a* to push against the sides of the protruding terminal 53. In other words, the protruding terminal 53 is resiliently pinched on both sides by the pair of contact arms 153*a*. The shape of the inner opening 154*a* gradually narrows in the width direction so that the opposing contact arms 153*a* approach each other. In other words, the opposing contact arms 153*a* have an inclined, tapered shape. As a result, the protruding terminal 53 can be smoothly introduced to the interval between opposing contact arms 153*a*.

Each female conductor 151 has a tail portion 158 extending forward and backward from the front end and rear end of the base film 115. The mounting surface of the tail portion 158 is exposed to the mounting surface of the female connector 101, and is connected by solder to a connection pad (not shown) formed on the surface of the second board 191. In this way, the female connector 101 is secured to the second board 191, and the female conductors 151 are connected electrically to the corresponding conductive traces on the second board 191.

Female reinforcing metal fittings 155 arranged on the left and right sides of the female conductors 151 have engaging recesses 156 formed on the inner edge facing the female conductors 151. The engaging recesses 156 are slender rectangular openings extending in the longitudinal direction of the female connector 101, and function as a second mating guide unit for mating with the inserted male reinforcing metal fittings 56 of the male connector 1 and positioning the male connector 1 and the female connector 101. Engaging arms 157 serving as flexible terminals are formed on the side edges defined by the engaging recesses 156 of the female reinforcing metal fittings 155. The length of the engaging recesses 156 in the longitudinal direction is greater than the length of the male reinforcing metal fittings 56 in the longitudinal direction.

The female reinforcing metal fittings 155 are separated in the longitudinal direction into a front metal fitting portion 155*f* and a rear metal fitting portion 155*r*. The front metal fitting portions 155*f* and rear metal fitting portions 155*r* are separated electrically and insulated from each other. The front metal fitting portions 155*f* have a middle metal fitting portion 155*c* positioned in the middle portion of the female reinforcing metal fittings 155 in the longitudinal direction, and have an engaging arm 157 extending in the longitudinal direction along the side edge opposite the female conductors 151 in the engaging recess 156.

The base end of the engaging arm 157 is connected to the middle metal fitting portion 155*c*, and the free end is a cantilevered member extending towards the front (towards the lower left in FIG. 3), and an engagement protrusion 157*a* is integrally formed near the free end. That is, in a portion near the front end on the inside in the width direction of the female connector 101. That is, protruding in the direction of the opposing female conductors 151. The portion near the base end of the engaging protrusion 157*a* is preferably an inclined portion 157*b* inclined in the longitudinal direction of the engaging arm 157. The engaging arm 157 has spring action and is resiliently deformed in the width direction of the female connector 101. As a result, the engaging protrusion 157*a* positioned near the free end can be resiliently displaced in the width direction of the female connector 101. A slit-shaped space (gap) 157*c* is formed between the engaging arm 157 and the middle metal fitting portion 155*c* to allow for deformation of the engaging arm 157.

In this embodiment, a piezoelectric element 193 is arranged on the upper surface of the engagement arms 157. The piezoelectric element 193 is a thin-film element formed by applying a fluid material on the upper surface of the engagement arm 157. This adheres to the upper surface of the engaging arm 157 and is able to be deformed along with the upper surface of the engaging arm 157. As long as the piezoelectric element 193 can adhere to the upper surface of the engaging arm 157 so as to be deformable along with the upper surface of the engaging arm 157, it can be made using any manufacturing method. For example, a separately formed thin film can be bonded to the engaging arm 157 using a bonding agent.

A metal fitting insulating layer 194 is arranged on the upper surface of the middle metal fitting portion 155*c* in the portions other than the engaging arms 157; that is, in the portions of the upper surface of the middle metal fitting portion 155*c* on which a piezoelectric element 193 has not been adhered. The thickness is the same as the thickness of the piezoelectric element 193. In this way, the upper surfaces of the piezoelectric elements 193 and the metal fitting insulating layer 194 are essentially flush.

An upper conductive layer 195 is arranged on the upper surface of the piezoelectric elements 193 and the metal fitting insulating layer 194. The upper conductive layer 195 is a thin, plate-like conductive member with an L-shape. The front-end portion extending in the longitudinal direction of the female connector 101 is bonded to the upper surface of the piezoelectric element 193, and deformable along with the upper surface of the engaging arm 157. The other portion is bonded to the upper surface of the metal fitting insulating layer 194. The upper conductive layer 195 is formed by applying a material on the upper surface of the piezoelectric elements 193 and the metal fitting insulating layer 194. As long as it can adhere to the upper surface of the piezoelectric elements 193 deformable along with the upper surface of the piezoelectric elements 193, it can be made using any manufacturing method. In this way, the upper conductive layer 195 bonded to the surface of the piezoelectric element 193 and to the middle metal fitting portion 155*c* including the engaging arm 157 on which the piezoelectric element 193 is bonded function as a pair of electrodes for the piezoelectric element 193. As a result, the voltage generated by the piezoelectric element 193 by the deformation of the engaging arm 157 can be detected.

A terminal-matching opening 115*a*, an engaging recess-matching opening 115*b*, and a middle metal fitting portion-matching opening 115*c* passing through the base film 115 in the direction of thickness are formed in the portion of the base film 115 corresponding to the receiving terminals 153, in the portion of the film corresponding to the engaging recess 156, and in the portion of the film corresponding to the middle metal fitting portion 155*c*. Typically, the terminal-matching openings 115*a* and engaging recess-matching openings 115*b* have a rectangular shape in which the long axis is in the longitudinal direction and have a size corresponding to that of the terminal-accommodating opening 154 and the engaging recess 156.

The cover film 117 laminated on top of the conductive pattern 150, the adhesive layer 118, and the reinforcing frame layer 116 form a frame for the female connector 101. The frame is a flat, square-shaped member, and the recess defined by the periphery of the frame functions as a connection recess for accommodating the male connector 1. This frame has been omitted from the example shown in FIG. 1 for explanatory purposes.

The cover film 117 is a female covering portion serving as a second covering portion, which is a thin, insulating, plate-like member. The cover film 117 has a central opening 117*a* forming a recessed portion, and a middle metal fitting portion-matching opening 117*c* formed in the position corresponding to the middle metal fitting portion 155*c*. Both side portions of the central opening 117*a* in the width direction have engaging recess-matching openings 117*b* corresponding to the engaging recesses 156.

The reinforcing frame layer 116 has a central opening 118*a* forming a recess, and a middle metal fitting portion-matching opening 118*c* formed in the portion corresponding to the middle metal fitting portion 155*c*. Both side portions of the central opening 118*a* in the width direction have engaging recess-matching openings 118*b* corresponding to the engaging recesses 156. The reinforcing frame layer 116 has a central opening 116*a* forming a recess, and a middle metal fitting portion-matching opening 116*c* formed in the portion corresponding to the middle metal fitting portion 155*c*. Both side portions of the central opening 116*a* in the width direction have engaging recess-matching openings 116*b* corresponding to the engaging recesses 156.

Figure 1:
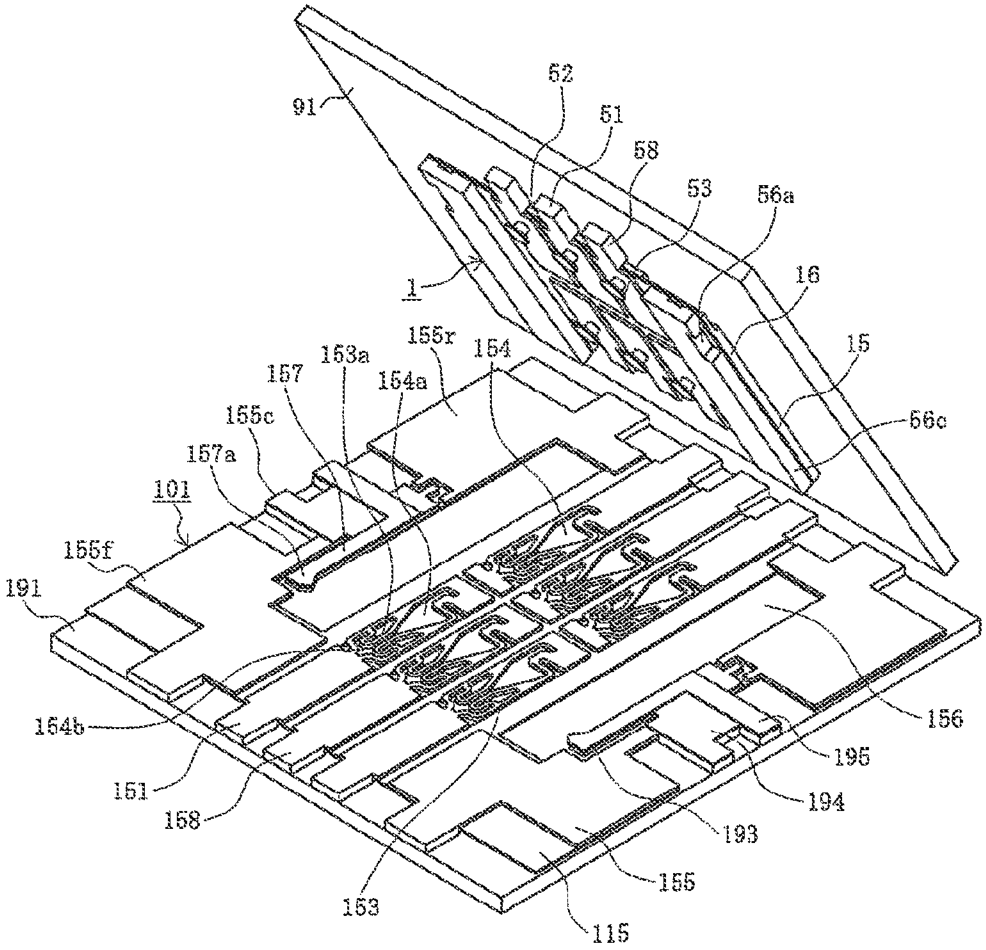
FIG. 1 is a perspective view of the mating surfaces of a male connector and a female connector, in accordance with the Present Disclosure, facing each other on an incline.

Pursuant to the mating operation for a male connector 1 and a female connector 101, as shown in FIG. 1, the male connector 1 and the female connector 101 are mounted on the surface of a first board 91 and a second board 191, respectively. As mentioned above, the frame of the female connector 101 has been omitted from the example in FIG. 1 for explanatory purposes.

First, the operator arranges the male connector 1 so that the surface on which the protruding terminals 53 have been formed faces the surface of the female connector 101. That is, the surface of the male connector 1 is substantially parallel to the surface of the female connector 101, and the male connector 1 is positioned above the female connector 101 so that the male connector 1 is aligned with the substantially square-shaped recess in the frame of the female connector 101.

Figure 8:
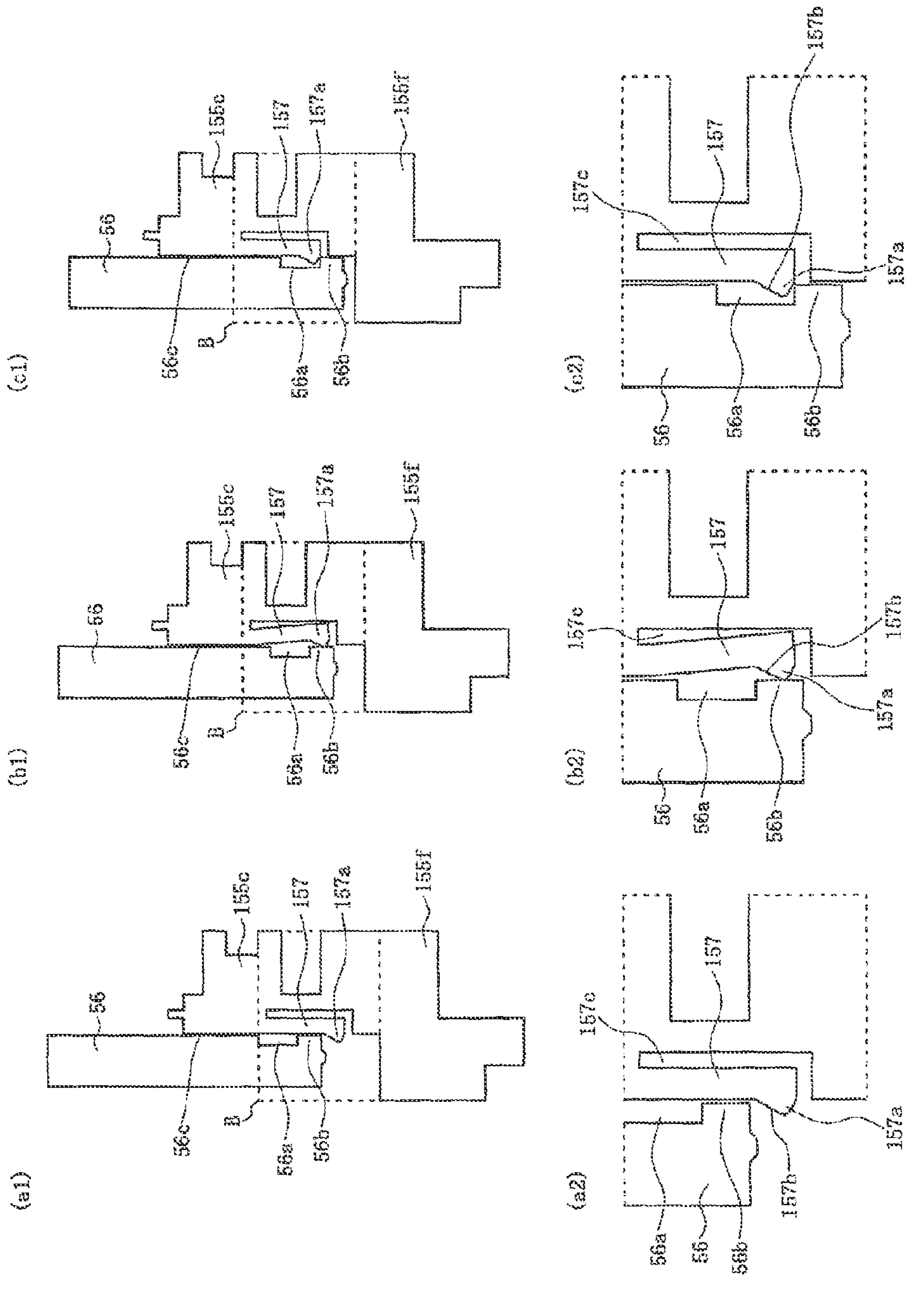
FIG. 8 is a diagram illustrating the change in the positional relationship between the reinforcing metal fitting of the male connector of FIG. 1 and the engaging arm of the female connector of FIG. 1, in which (*a*1) through (*c*1) show each step of the mating operation for the male connector and the female connector, and in which (*a*2) through (*c*2) are enlarged views of Section B in (*a*1) through (*c*1)

Next, the operator lowers the male connector 1 relative to the female connector 101. That is, moves the male connector 1 in the mating direction and into the recess in the frame of the female connector 101 until the mating surface of the male connector 1 comes into contact with the mating surface of the female connector 101. The left and right male reinforcing metal fittings 56 on the male connector 1 are introduced to the left and right engaging recesses 156 on the female connector 101 in order to position the male connector 1 and the female connector 101. The male reinforcing metal fittings 56 are introduced at a position near the rear ends of the engaging recesses 156. That is, the rear ends of the male reinforcing metal fittings 56 are brought close to the rear ends of the engaging recesses 156. Next, the protruding terminals 53 are introduced into the inner openings 154*a* on the inside of the corresponding receiving terminals 153. The positional relationship between the male reinforcing metal fittings 56 of the male connector 1 and the engaging arms 157 of the female connector 101 in this state are shown in FIGS. 8(*a*1)-(*a*2). Because the male reinforcing metal fittings 56 are positioned near the rear end of the engaging recesses 156, the front ends of the male reinforcing metal fittings 56 are positioned to the rear of the engaging protrusions 157*a* of the engaging arms 157 (upward in FIG. 8). Therefore, the engaging arms 157 are not deformed initially.

Next, the operator slides the male connector 1 relative to the female connector 101 in the locking direction. In other words, the male connector 1 is moved towards the front of the female connector 101 (lower left in FIG. 1) with the surface of the male connector 1 in contact with the surface of the female connector 101. Because the protruding terminals 53 have been introduced into the inner openings 154*a* on the inside of the corresponding receiving terminals 153, and the left and right male reinforcing metal fittings 56 have been introduced to the left and right engaging recesses 156 to guide this sliding operation, the male connector 1 does not become misaligned with respect to the female connector 101.

When the male connector 1 has slid relative to the female connector 101 in the locking direction, the front end of the male reinforcing metal fittings 56 advances towards the front end of the engaging recesses 156. As a result, the engaging protrusions 157*a* of the engaging arms 157 ride over the ride-over portion 56*b* on the side edges 56*c* of the male reinforcing metal fittings 56 near the front end. At this time, the inclined portion 157*b* of the engaging protrusions 157*a* makes contact with the front end of the ride-over portions 56*b*. As a result, the engaging protrusions 157*a* can smoothly ride over the ride-over portions 56*b*. Then, the engaging arms 157 are resiliently deformed in the width direction of the female connector 101, and the engaging protrusion 157*a* positioned near the free end is resiliently displaced outward in the width direction of the female connector 101. Because a gap portion 157*c* is formed between an engaging arm 157 and the middle metal fitting portion 155*c*, the engaging arm 157 does not make contact with the middle metal fitting portion 155*c* even when the engaging portion 157*a* has reached maximum displacement outward in the width direction of the female connector 101 as shown in FIGS. 8(*b*1)-(*b*2). That is, the engaging arms 157 are able to be deformed freely without becoming restrained.

Figure 5:
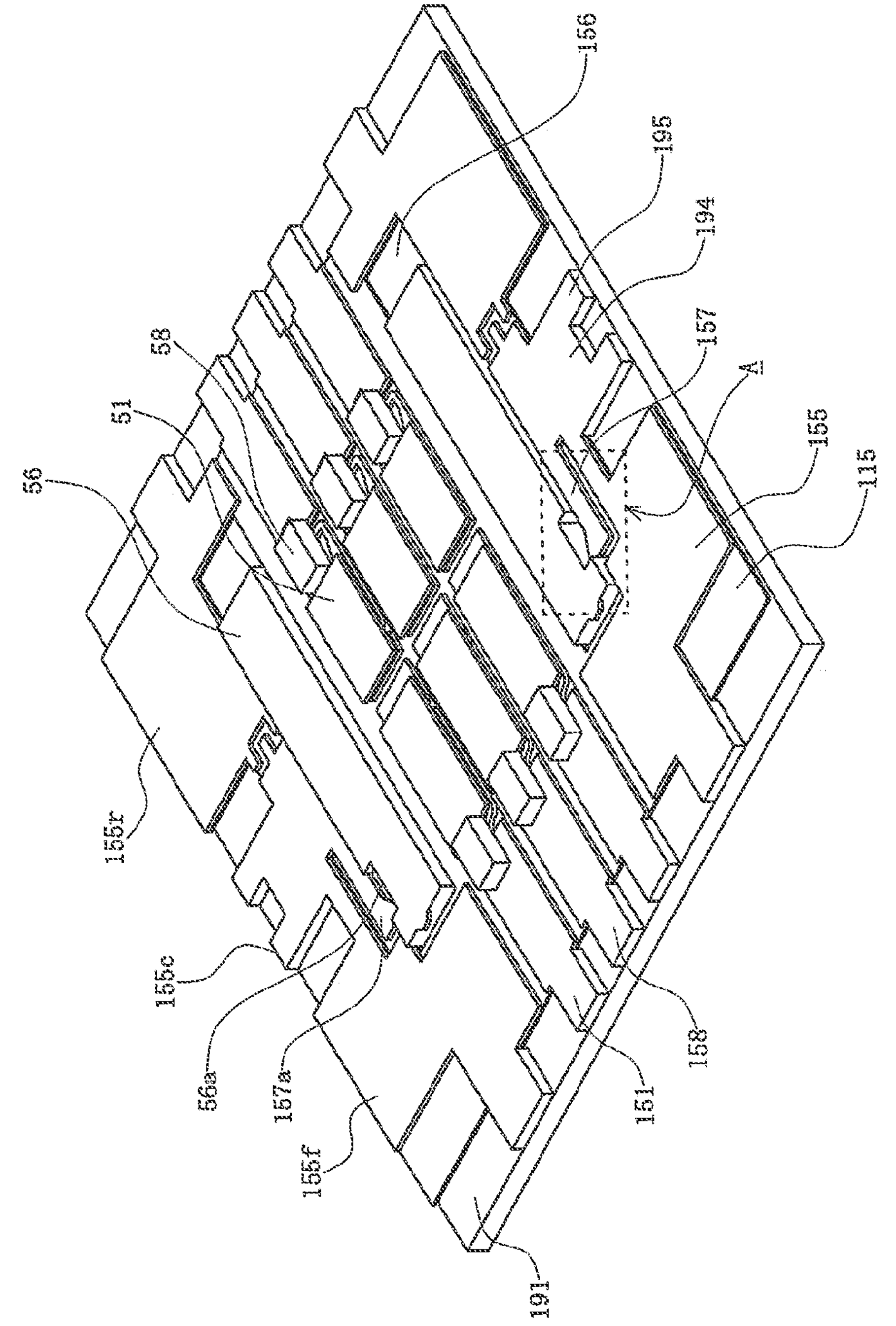
FIG. 5 is a perspective view showing the mated male and female connectors of FIG. 1, with the base film of the male connector, the reinforcing layer and the first board removed.
Figure 6:
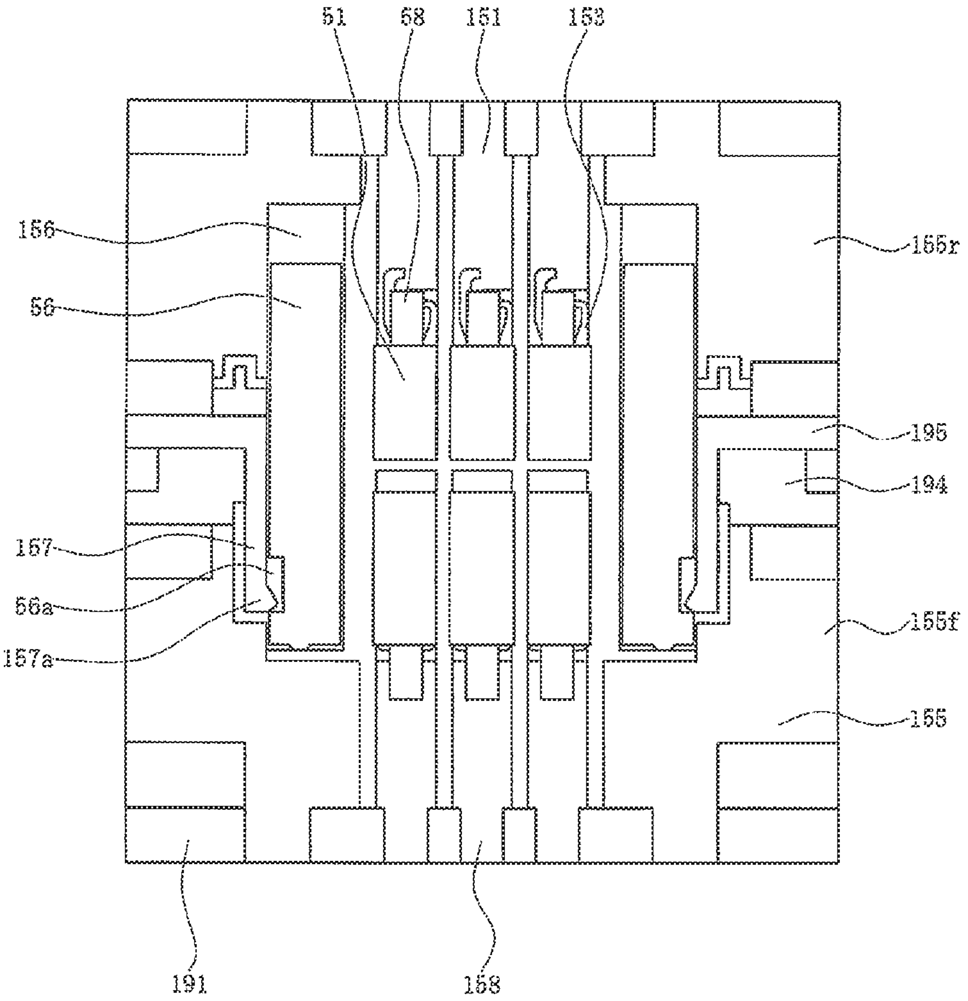
FIG. 6 is a plan view showing the mated male and female connectors of FIG. 1, with the base film of the male connector, the reinforcing layer and the first board removed.
Figure 7:
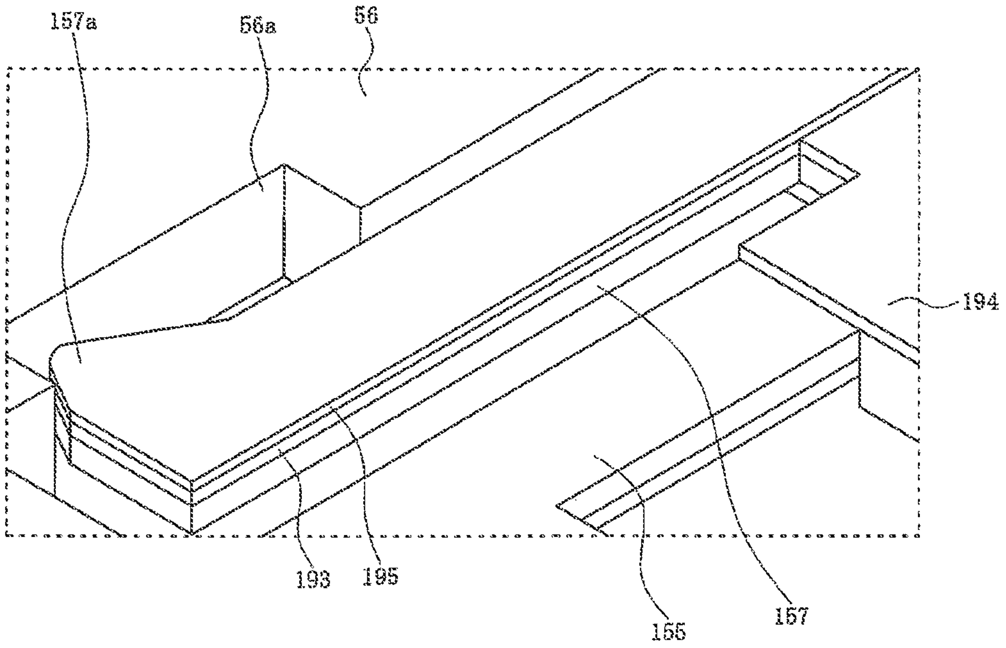
FIG. 7 is a perspective view showing the reinforcing metal fitting of the male connector of FIG. 1 engaging the engaging arm of the female connector of FIG. 1 (also an enlarged view of Section A of FIG. 5)

When, as shown in FIGS. 5-6, mating of the male connector 1 and the female connector 101 has been completed, the engaging recesses 56*a* on the left and right male reinforcing metal fittings 56 in the male connector 1 engage the engaging protrusions 157*a* of the left and right engaging arms 157 in the female connector 101. More specifically, as shown in FIGS. 8(*c*1)-(*c*2), the engaging protrusions 157*a* on the engaging arms 157 ride over the ride-over portions 56*b* of the male reinforcing metal fittings 56, and the engaging arms 157 return to their original shape due to their inherent spring action. The engaging protrusions 157*a* are displaced inward in the width direction of the female connector 101 and enter the engaging recesses 56*a*. In this way, the engaging recesses 56*a* on the male reinforcing metal fittings 56 mesh with the engaging protrusions 157*a* on the engaging arms 157, and the male connector 1 and the female connector 101 become locked and remain mated.

Also, because the engaging protrusions 157*a* on the engaging arms 157 engage the engaging recesses 56*a* on the male reinforcing metal fittings 56, the male connector 1 is prevented from sliding relative to the female connector 101 in the counter locking direction. Therefore, the male connector 1 does not slide relative to the female connector 101 in the counter locking direction and become unlocked even when they have been subjected to external shocks or vibrations. As a result, the male connector 1 and the female connector 101 remain mated. Because the operator can apply pressure using a finger to sufficiently overcome the spring action applied to the engaging protrusions 157*a*, the operator can slide the male connector 1 relative to the female connector 101 in the counter locking direction, and disengage and unlock the engaging protrusions 157*a* and the engaging recesses 56*a*.

When the male connector 1 is slid relative to the female connector 101 in the locking direction, that is, in the forward direction, a protruding terminal 53 inside the inner opening 154*a* of a receiving terminal 153 moves within the inner opening 154*a* and advances into the space between the opposing pair of contact arms 153*a*. Because the side surfaces of the protruding terminal 53 come into contact with the opposing pair of contact arms 153*a* thereby pushing them apart, the spring action of the contact arms 153*a* applies pressure from the opposing portions of the contact arms 153*a* to the side surfaces of the protruding terminal 53. In other words, the protruding terminal 53 is resiliently pinched from both sides by the pair of contact arms 153*a*. In this way, the mating can be maintained even when the protruding terminals 53 are pinched by the contact arms 153*a*.

The receiving terminals 153 are thin members, and the thickness dimension of the contact arms 153*a* is smaller than the height dimension of the protruding terminals 53. This allows for reliable insertion of the protruding terminals 53 into the inner openings 154*a* of their corresponding receiving terminals 153, and reliable contact with the side surfaces of the protruding terminals 53 and the contact arms 153*a*, even if there is misalignment between protruding terminals 53 and receiving terminals 153 in the mating direction of the male connector 1 and the female connector 101 due to dimensional tolerances and shape distortion.

The width dimension of the inner openings 154*a* becomes smaller as the opposing portions of the contact arms 153*a* approach each other. As a result, the protruding terminals 53 smoothly advance into the space between opposing portions of the contact arms 153*a*, and the interval between the opposing portions of the contact arms 153*a* can be smoothly spread apart.

Figure 4:
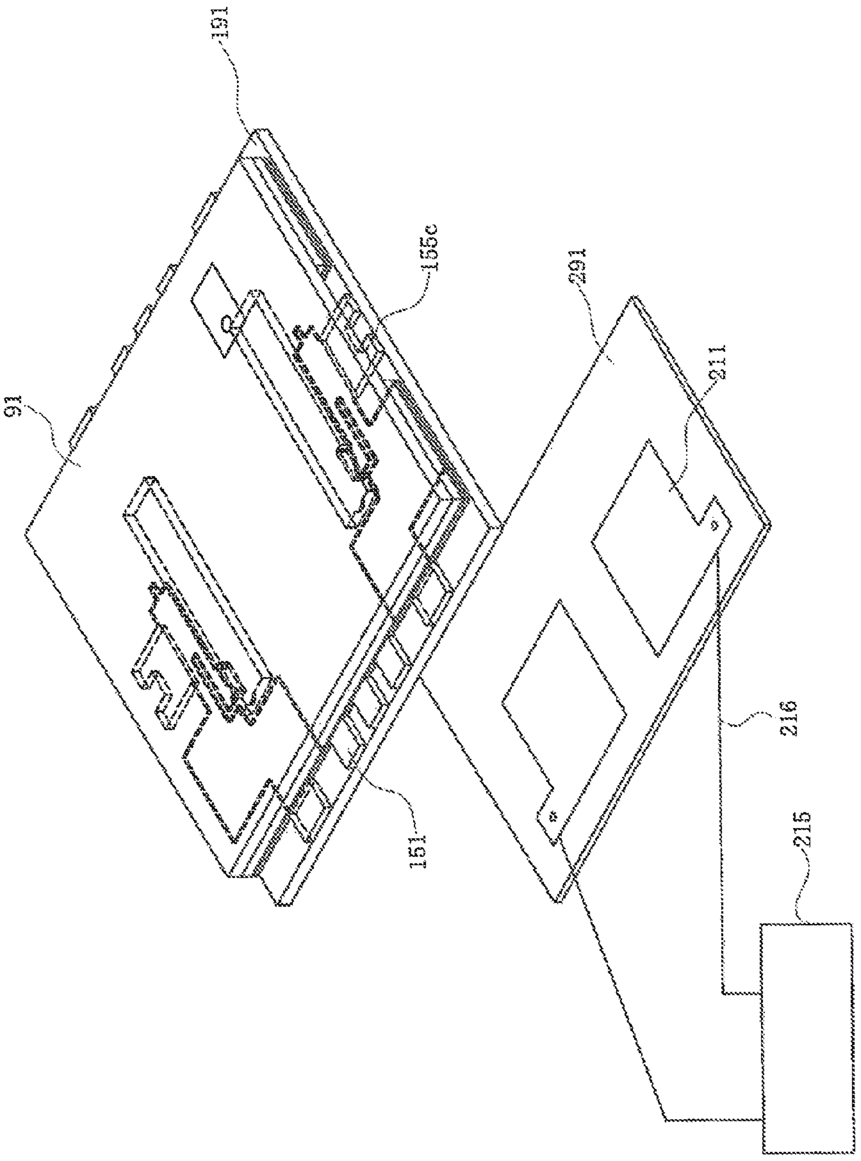
FIG. 4 is a perspective view used to illustrate the detection operation performed after the male and female connectors of FIG. 1 have been mated.

In this embodiment, the mating of the male connector 1 and the female connector 101 can be reliably detected by detecting the voltage generated by the piezoelectric elements 193 due to distortion of the engaging arms 157. More specifically, as shown in FIG. 4, a detection board 291 is used. Detection electrodes 21 made of metal sheets are formed on the surface of this board. The detection board 291 has a dimension in the width direction which is substantially the same as the dimension of the female connector 101 in the width direction. A pair of detection electrodes 211 are also arranged in the portion corresponding to the pair of middle metal fixture portions 155*c* with engaging arms 157.

The detection board 291 is arranged so that the surface of the detection board 291 is substantially parallel to the surface of the second board 191 mounted on the female connector 101 without the male connector 1 and the female connector 101 making contact with each other. Preferably, the detection board 291 is arranged near the board that does not move during the mating operation for the male connector 1 and the female connector 101 (the second board 191 when the male connector 1 is moved or the first board 91 when the female connector 101 is moved). Preferably, the position of the detection board 291 is also established so that the surface of the detection electrodes 211 faces the surface of the middle metal fitting portion 155*c*.

In this Figure, 215 is a voltage measuring device such as an oscilloscope or a data logger connected to each detection electrodes 211 by a conductive wire 216. In this way, the voltage generated by the piezoelectric elements 193 due to the distortion of the engaging arms 157 can be detected by the voltage measuring device 215. More specifically, the upper conductive layer 195 formed on the surface of the piezoelectric elements 193 and on the middle metal fitting portions 155*c* including the engaging arms 157 on which the piezoelectric elements 193 have been applied function as a pair of electrodes for the piezoelectric elements 193. As a result, the change in the voltage of the pair of electrodes can be detected by the detection electrodes 211 without making contact, and the voltage generated by the piezoelectric elements 193 can be detected.

Figure 9:
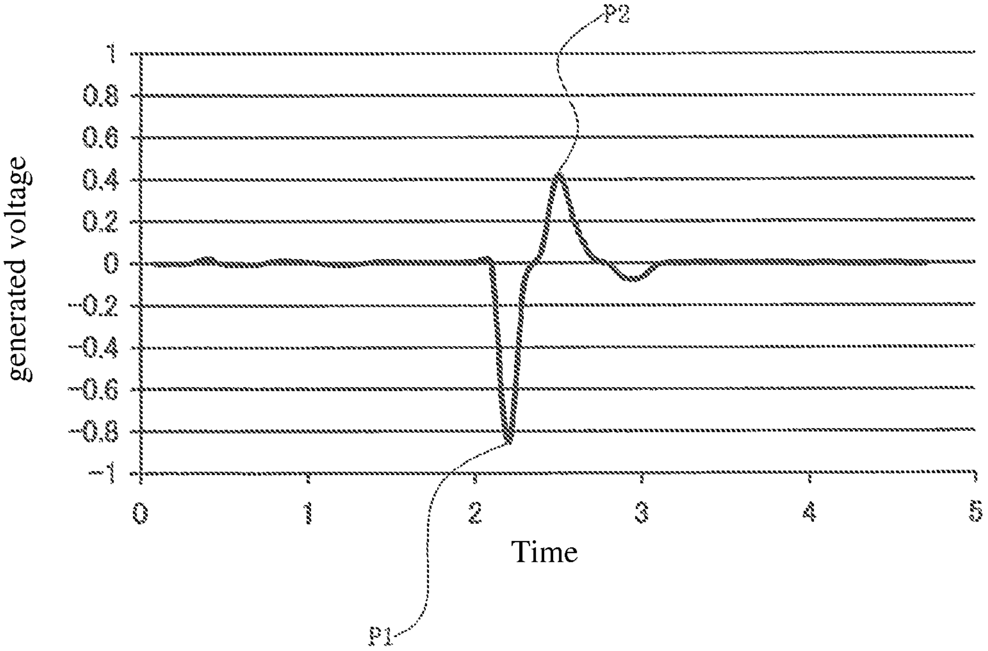
FIG. 9 is a diagram showing the change in voltage generated by the piezoelectric element, in accordance with the Present Disclosure.

An experiment was conducted in which the voltage generated by the piezoelectric elements 193 was measured. The results are shown in FIG. 9. The voltage measuring devices 215 used in the experiment were a TDS1012 oscilloscope and a GL800 data logger. Also, as shown in FIG. 4, the detection board 291 was arranged below the second board 191 with a space between the boards, and the surface of the detection board 291 was arranged parallel to the surface of the second board 191 mounted on the female connector 101. In the experiment, the distance between the second board 191 and the detection board 291 was from 2-3 cm, and the voltage could be measured to a distance of up to 10 cm. In FIG. 9, the horizontal axis denotes the time, and the vertical axis denotes the voltage generated by the piezoelectric elements 193. The initial voltage of the piezoelectric elements 193; that is, the voltage when the engaging arms 157 deformed along with the piezoelectric elements 193 were not deformed, is zero.

As shown in FIG. 9, the first peak P1 was detected and then the second peak P2 was detected during the mating operation of the male connector 1 and the female connector 101. The first peak P1 and the second peak P2 have reverse polarity. In the example shown in FIG. 9, the polarity of the first peak P1 is negative, and the polarity of the second peak P2 is positive. The positive and negative polarities can be changed if necessary. The values of the first peak P1 and the second peak P2 can be adjusted if necessary by changing the sensitivity of the voltage measuring device 215.

As shown in FIGS. 8(*b*1)-(*b*2), the first peak P1 is believed to indicate the voltage generated by the significant deformation of the engaging arms 157 and piezoelectric elements 193 when the engaging protrusions 157*a* ride over the ride-over portions 56*b* and are maximally displaced outward in the width direction of the female connector 101. As shown in FIGS. 8(*c*1)-(*c*2), the second peak P2 is believed to indicate the voltage generated by the deformation of the engaging arms 157 and piezoelectric elements 193 in the opposite direction while returning to their original position when the engaging protrusions 157*a* ride over the ride-over portions 56*b*, are displaced inward in the width direction of the female connector 101, and enter the engaging recesses 56*a*. Therefore, the completion of the mating operation of the male connector 1 and the female connector 101 can be discerned when the second peak P2 has been detected.

The operation performed to release the mated male connector 1 and female connector 101 is simply the reverse of the operation performed to mate the male connector 1 and the female connector 101. Therefore, explanation of the releasing operation has been omitted.

In this embodiment, an example was explained in which engaging recesses 56*a* and ride-over portions 56*b* were formed in the side edges 56*c* of the male reinforcing metal fittings 56, and engaging protrusions 157*a* were formed in the engaging arms 157. However, engaging protrusions with the same shape as engaging protrusions 157*a* can be formed in the side edges 56*c* of the male reinforcing metal fittings 56, and engagement recesses and ride-over portions with the same shapes as engaging protrusions 56*a* and ride-over portions 56*b* can be formed in the engaging arms 157. In other words, the engaging protrusions can be included in either the side edges 56*c* of the male reinforcing metal fittings 56 or the engaging arms 157, and the engaging recesses and ride-over portions can be included on the opposite side.

Accordingly, in this embodiment, the male reinforcing metal fittings 56 include side edges 56*c* serving as fixed terminals for detecting the mating of the male connector 1 and the female connector 101, the engaging recesses 156 included engaging arms 157 serving as resilient terminals for detecting the mating of the male connector 1 and the female connector 101, and the piezoelectric elements 193 are arranged on either the side edges 56*c* or the engaging arms 157. Because the completion of the mating operation of the male connector 1 and the female connector 101 can be detected based on the voltage generated by the piezoelectric elements 193, the completion of the mating operation of the male connector 1 and the female connector 101 can be detected accurately, and misalignment can be reliably prevented during the mating operation.

When the engaging protrusions 157*a* are included in either the side edges 56*c* of the male reinforcing metal fittings 56 or the engaging arms 157, and the engaging recesses 56*a* and ride-over portions 56*b* are included on the opposite side, and the male connector 1 and the female connector 101 are mated, the male reinforcing metal fittings 56 move relative to the engaging recesses 156, and the engaging protrusions 157*a* ride over the ride-over portion 56*b* and engage the engaging recesses 56*a*. Because the deformation of the piezoelectric elements 193 is significant, and the resulting change in voltage is also significant, the completion of the mating operation of the male connector 1 and the female connector 101 can be detected accurately, and misalignment can be reliably prevented during the mating operation.

The piezoelectric elements 193 are arranged on the deformed surface of the engaging arms 157, and are deformed along with the surface. This generates voltage. More specifically, the piezoelectric elements 193 are arranged on the upper surface of the engaging arms 157 serving as the resilient terminal for detecting the completion of the mating operation of the male connector 1 and the female connector 101. In other words, the piezoelectric elements 193 are arranged on the plane parallel to the direction of deformation of the engaging arms 157, and the completion of the mating operation of the male connector 1 and the female connector 101 is detected based on the change in the voltage generated by the piezoelectric elements 193. Because the deformation of the piezoelectric elements 193 is significant, and the resulting change in voltage is also significant, the completion of the mating operation of the male connector 1 and the female connector 101 can be detected accurately, and misalignment can be reliably prevented during the mating operation.

A pair of electrodes is connected to a piezoelectric element 193, and the change in voltage between the pair of electrodes is detected by the detection electrode 211 without making contact to detect the completion of the mating operation by the male connector 1 and the female connector 101. In this way, the change in voltage generated by the piezoelectric elements 193 can be detected without making contact, and the voltage measuring device 215 and the detection board 291 can be arranged in the desired positions.

Also, the mating operation of the male connector 1 and the female connector 101 is detected by detecting the first peak P1 and the second peak P2, which has the reverse polarity of the first peak P1, included in the change of voltage generated by the piezoelectric elements 193. More specifically, the voltage generated by the piezoelectric elements 193 has two peaks in the mating process for the male connector 1 and the female connector 101. As soon as the second peak P2, which is the second generated peak, is detected, it can be determined that the mating of the male connector 1 and the female connector 101 has been completed. Therefore, the second peak P2 indicating the completion of the mating process can be reliably identified, and the completion of the mating reliably detected even when there is external noise from the voltage measuring device 215 or some other device.

The polarity of the second peak P2 is the reverse of the polarity of the first peak P1, which is the first generated peak. Therefore, the first peak P1 and the second peak P2 can be reliably identified, and the mating reliably detected even when there is external noise from the voltage measuring device 215 or some other device.

Also, the male connector 1 includes plate-like male conductors 51, and the protruding terminals 53 are members protruding from the surface of the male conductors 51. The female connector 101 has plate-like female conductors 151, and the receiving terminals 153 are plate-like members formed by patterning the female conductors 151. A pair of contact arms 153*a* opposing each other are included along with inner openings 154*a* formed therein. When the protruding terminals 53 engage the receiving terminals 153, the protruding terminals 53 are resiliently pinched by the pair of contact arms 153*a*. In this way, contact between the receiving terminals 153 and the protruding terminals 53 can be stably maintained, and short-circuiting reliably prevented.

In the following explanation of a second embodiment of the Present Disclosure, the elements with a structure similar to those in the first embodiment are denoted by the same reference numbers, and further explanation of these elements has been omitted. Explanation of operations and effects similar to those of the first embodiment has also been omitted.

Figure 10:
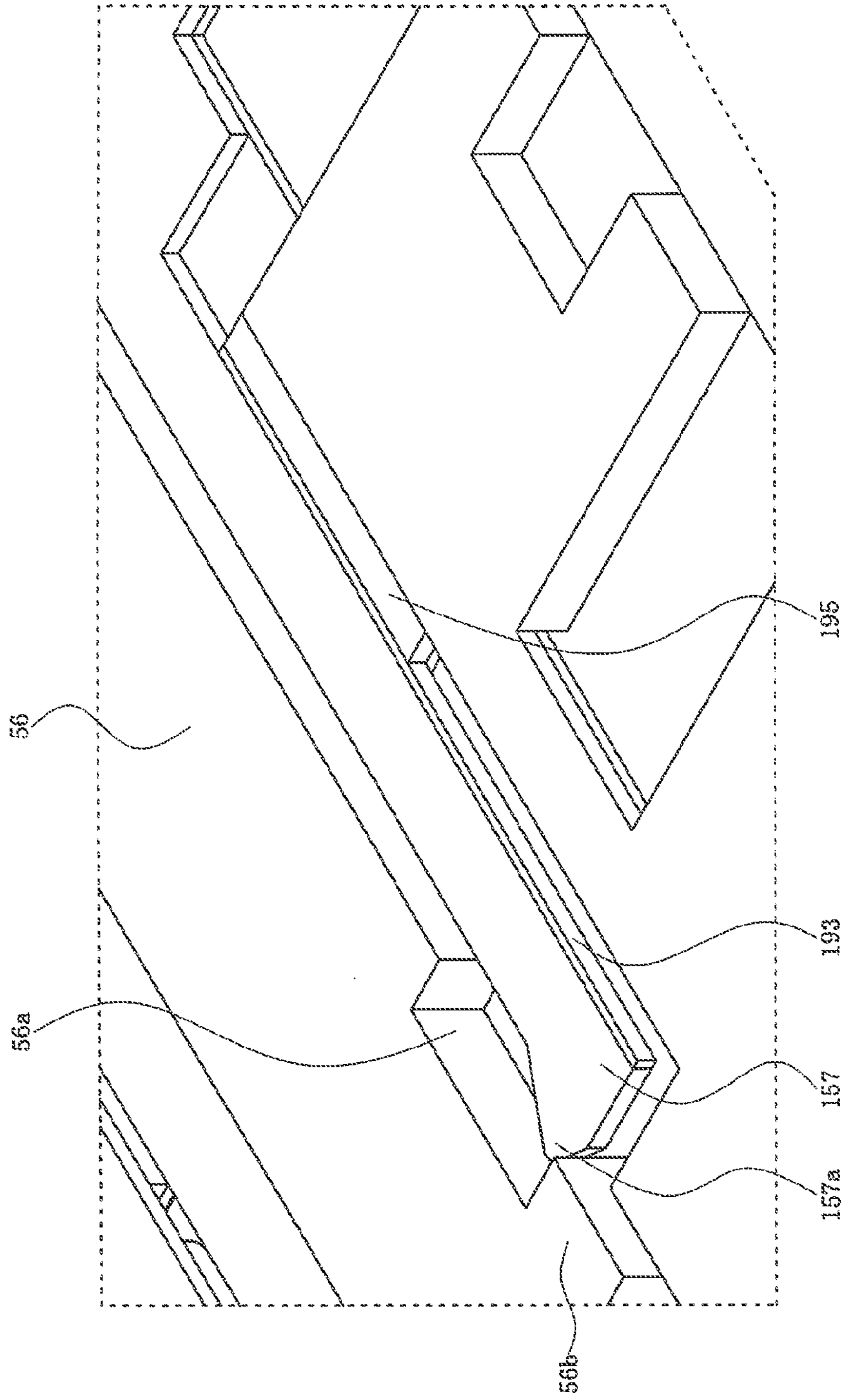
FIG. 10 is an enlarged perspective view of the essential portions of the male reinforcing metal fitting of a male connector engaging the engaging arm of a female connector, in accordance with the Present Disclosure.

In this embodiment, as shown in FIG. 10, the piezoelectric element 193 is arranged on the side surface to the outside of the engaging arm 157 in the width direction of the female connector 101, that is, on a plane perpendicular to the direction of deformation for the engaging arm 157. The piezoelectric element 193 is a thin-film element that can also be formed by applying a liquid material to the side surface of the engaging arm 157. This is applied to the side surface of the engaging arm 157 and is able to be deformed along with the side surface of the engaging arm 157. As long as the piezoelectric element 193 can be applied to the side surface of the engaging arm 157 so as to be deformable along with the side surface of the engaging arm 157, any manufacturing method can be used to make the piezoelectric element 193.

Upper conductive layer 195 can be arranged on the surface opposite the side surface of the engaging arm 157 on which the piezoelectric element 193 has been formed. In this way, an upper conductive layer 195 formed on the same surface of the engaging arm 157 as the piezoelectric element 193 and formed on the other surface of the piezoelectric element 193 function as a pair of electrodes for the piezoelectric element 193. As a result, the voltage generated by the piezoelectric element 193 due to deformation of the engaging arm 157 can be detected.

The other elements of the configuration and the other operations are similar to those of the first embodiment, and further explanation of these has been omitted.

In this embodiment, the piezoelectric element 193 is arranged on the side surface to the outside of the engaging arm 157 in the width direction of the female connector 101 (on a plane perpendicular to the direction of deformation for the engaging arm 157), and completion of the mating operation for the male connector 1 and the female connector 101 is detected based on a voltage change generated by the piezoelectric element 193. Therefore, the area of the piezoelectric element 193 is narrowed, and the amount of piezoelectric elements 193 used is reduced. The amount of deformation by the piezoelectric element 193 is smaller, and the resulting change in voltage is smaller. However, completion of the mating operation can be reliably detected because, as in the first embodiment, the voltage generated by the piezoelectric element 193 includes a first peak P1 and a second peak P2.

The following is an explanation of a third embodiment of the Present Disclosure. Again, the elements with a structure similar to those in the first embodiment and the second embodiment are denoted by the same reference numbers, and further explanation of these elements has been omitted. Explanation of operations and effects similar to those of the first embodiment and the second embodiment has also been omitted.

Figure 11:
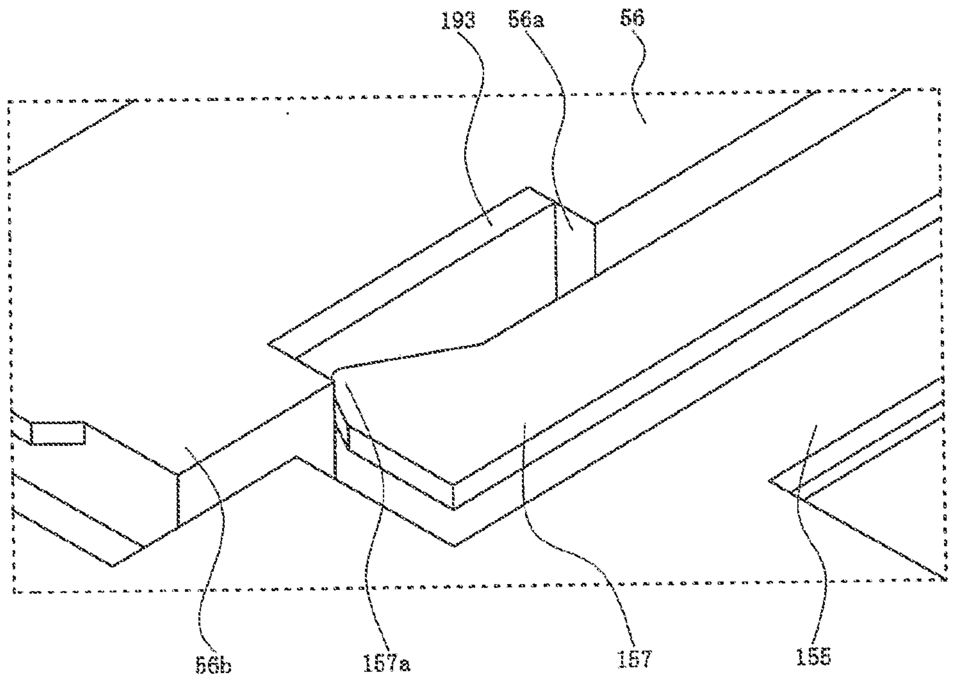
FIG. 11 is an enlarged perspective view of the essential portions of the male reinforcing metal fitting of a male connector engaging the engaging arm of a female connector, in accordance with the Present Disclosure.

In this embodiment, as shown in FIG. 11, the piezoelectric element 193 is arranged on the side surface of the male reinforcing metal fitting 56 of the male connector 1. More specifically, the piezoelectric element 193 is arranged on the bottom surface of the engaging recess 56*a*, that is, on a plane perpendicular to the direction of deformation for the engaging arm 157, and the engaging protrusion 157*a* inserted into the engaging recess 56 comes into contact with the piezoelectric element 193. The piezoelectric element 193 is a thin-film element that can be formed by applying a liquid material to the bottom surface of the engaging recess 56*a*. As long as the piezoelectric element 193 can be applied to the bottom surface of the engaging recess 56*a*, any manufacturing method can be used to make the piezoelectric element 193.

The electrodes of the piezoelectric element 193 are not shown in the Figures but electrodes can be arranged on the wall surfaces of the front end (lower left end in the Figure) and the rear end (upper right end in the drawing) of the engaging recess 56*a*. In this way, the voltage generated by the piezoelectric element 193 can be detected. Because the piezoelectric element 193 in this embodiment is arranged on the bottom surface of the engaging recess 56*a* in the male reinforcing metal fitting 56, as shown in FIGS. 8(*c*1)-(*c*2), when the engaging protrusion 157*a* on the engaging arm 157 rides over the ride-over portion 56*b* of the male reinforcing metal fitting 56, and the spring action of the engaging arm 157 causes the engaging protrusion 157*a* to enter the engaging recess 56*a* and come into contact with the piezoelectric element 193, deforming pressure is applied to the piezoelectric element 193, and voltage is generated.

When the voltage generated by the piezoelectric element 193 was measured in this embodiment, the voltage, as in the example shown in FIG. 9, had two peaks; that is, it had a first peak P1 and a second peak P2. The first peak P1 is believed to be caused by the impact of the deforming pressure on the piezoelectric element 193 when the engaging protrusion 157*a* having ridden over the ride-over portion 56*b* comes into contact with the piezoelectric element 193 at the bottom of the engaging recess 56*a* with force. The second peak P2, which has the reverse polarity of the first peak P1, is believed to be caused by the reaction to the impact when the engaging protrusion 157*a* is displaced in the opposite direction and the piezoelectric element 193 is deformed in the opposite direction. Because the metal fitting insulating layer 194 and the upper conductive layer 195 explained in the first embodiment are not required in this embodiment, they can be eliminated.

The other elements of the configuration and the other operations are similar to those of the first embodiment, and further explanation of these has been omitted.

In this embodiment, the piezoelectric element 193 is arranged on the side edge 56*c* of the male reinforcing metal fitting 56, a surface with which the engaging arm 157 comes into contact. The engaging arm 157 presses against the piezoelectric element 193. Voltage is generated. More specifically, the piezoelectric element 193 is arranged on the side surface of the male reinforcing metal fitting 56 serving as the fixed terminal for detecting the completion of the mating operation of the male connector 1 and the female connector 101. In other words, the piezoelectric element 193 is arranged on the bottom surface of the engaging recess 56*a*, which is on a plane perpendicular to the direction of deformation for the engaging arm 157, and the completion of the mating of the male connector 1 and the female connector 101 is detected based on the change in voltage generated by the piezoelectric element 193 to which pressure has been applied in the engaging recess 56*a*. Therefore, the area of the piezoelectric element 193 can be narrowed, and the amount of piezoelectric elements 193 used can be reduced. Because a generic piezoelectric element 193 is simply attached to the surface of a fixed member, a commercially available piezoelectric element can be used as the piezoelectric element 193, and costs can be reduced. Further, the amount of deformation by the piezoelectric element 193 is smaller, and the resulting change in voltage is smaller, but completion of the mating operation can be reliably detected because, as in the first and second embodiments, the voltage generated by the piezoelectric element 193 includes a first peak P1 and a second peak P2.

The following is an explanation of a fourth embodiment of the Present Disclosure. As before, elements with a structure similar to those in the first through third embodiments are denoted by the same reference numbers, and further explanation of these elements has been omitted. Explanation of operations and effects similar to those of the first through third embodiments has also been omitted.

Figure 12:
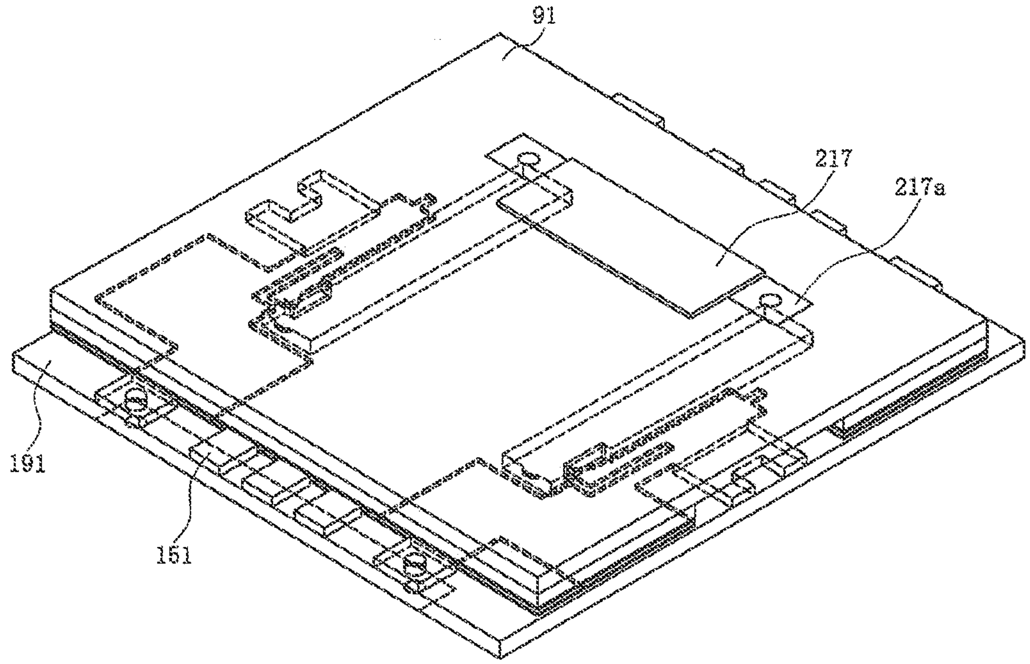
FIG. 12 is a perspective view used to explain the detection operation performed after a male connector and a female connector have been mated, in accordance with the Present Disclosure.
Figure 13:
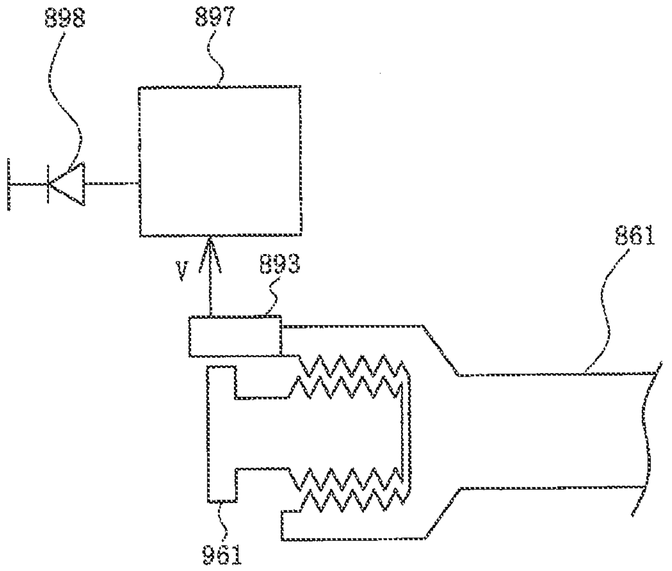
Prior art FIG. 13
FIG. 13 illustrates a conventional connector.

In this embodiment, as shown in FIG. 12, detection of the voltage generated by the piezoelectric elements 193 is performed by the color-changing member 217 shown in the drawing. The color-changing member 217 is a member consisting of an electrochromic material, a polymer material that changes color or eliminates color using an electrically induced reversible oxidation/reduction reaction. A pair of connection electrodes 217*a* is provided at the ends of this rectangular plate along the long axis. These connection electrodes 217*a* constitute the pair of electrodes for a piezoelectric element 193, and are connected via a conductive trace not shown in the Figure.

When voltage is generated by the piezoelectric elements 193, the color of the color-changing member 217 is changed by the voltage, and the voltage generated by the piezoelectric elements 193 can be detected. Because the color change of an electrochromic material usually lasts a certain amount of time, the operator can see the color change in the color-changing member 217 even when the voltage generated by the piezoelectric elements 193 changes for a short period of time. By selecting an electrochromic material that changes different colors depending on the voltage, the first peak P1 of the voltage generated by the piezoelectric elements 193 and the second peak P2 with the reverse polarity of the first peak P1 can be identified by different colors.

In the example shown, the color-changing member 217 is arranged on the rear surface of the first board 91. However, it can also be arranged on the rear surface of the second board 191, or arranged at a location other than the first board 91 and the second board 191. The color-changing member 217 can be arranged at any location as long as the location is visible to the operator and the connection electrodes 217*a* can connected electrically to the electrodes of the piezoelectric elements 193.

The other elements of the configuration and the other operations are similar to those of the first through third embodiments, and further explanation of these has been omitted.

In this embodiment, a change in the voltage generated by a piezoelectric element 193 can be detected by the change in color of the color-changing member 217 consisting of an electrochromic material. In this way, completion of the mating of the male connector 1 and the female connector 101 is detected. Therefore, the operator can easily determine that the mating of the male connector 1 and the female connector 101 has been completed by noticing the change in the color of the color-changing member 217. Also, a voltage measuring device 215 and a detection board 291 are not required, the configuration can be simplified, and costs can be reduced.

While a preferred embodiment of the Present Disclosure is shown and described, it is envisioned that those skilled in the art may devise various modifications without departing from the spirit and scope of the foregoing Description and the appended Claims.

What is claimed is:

1. A connector, the connector comprising:

a first connector, the first connector including a first terminal and a first mating guide portion;

and a second connector, the second connector including a second terminal engaging the first terminal and a second mating guide portion fitted with the first mating guide portion; wherein:

the first mating guide portion includes a fixed terminal, the fixed terminal configured to detect the mating of the first connector and the second connector;

the second mating guide portion includes a resilient terminal, the resilient terminal configured to detect the mating of the first connector and the second connector;

one of the fixed terminal and the resilient terminal further includes an engaging protrusion and the other includes an engaging recess and a ride-over portion projecting from the engaging recess; and one of the fixed terminal and the resilient terminal including a piezoelectric element.

2. The connector of claim 1, wherein the first mating guide portion and the second mating guide portion move relative to each other.

3. The connector of claim 2, wherein the engaging protrusion rides over the ride-over portion and engages the engaging recess when the first connector and the second connector are mated.

4. The connector of claim 3, wherein the piezoelectric element is arranged on a deforming surface of the resilient terminal, and voltage is generated as the surface is deformed.

5. The connector of claim 3, wherein the piezoelectric element is arranged on a surface of the fixed terminal contacted by the resilient terminal, and voltage is generated as pressure is applied by the resilient terminal.

6. The connector of claim 3, wherein a pair of electrodes is connected to the piezoelectric element, and a change in voltage between the pair of electrodes is detected by a detection electrode without making contact, and completion of the mating of the first connector and the second connector is detected.

7. The connector of claim 6, wherein a pair of electrodes is connected to the piezoelectric element, and a change in color by a color-changing member comprising an electrochromic material conductive with the pair of electrodes is used to detect the completion of the mating of the first connector and the second connector.

8. The connector of claim 7, wherein the mating of the first connector and the second connector is detected by detecting a first peak included in a change in voltage, and a second peak having the reverse polarity of the first peak.

9. The connector of claim 8, wherein the first connector includes a plate-like first conductor, the first terminal being a member projecting from a surface of the first conductor.

10. The connector of claim 9, wherein the second connector further includes a plate-like second conductor, the second terminal being a plate-like member formed by patterning the second conductor.

11. The connector of claim 10, further including an inner opening formed on the inside thereof and a pair of contact arms opposing each other.

12. The connector of claim 11, wherein the pair of contact arms resiliently pinches the first terminal from both sides.

13. A low profile connector, comprising:

a first connector half including a first terminal and a first mating guide portion fixed in place with respect to the first connector half, and the first mating guide portion including a mating detection terminal fixed to the first connector half;

a second connector half including a second terminal and a second mating guide portion which is complementary on shape to and engageable with the first connector half first mating guide portion, the second mating guide portion including a mating detection terminal resiliently supported by the second terminal half;

a piezoelectric element coupled to one of the mating detection terminals for indicating mating of the first and second connector halves; and one of the two mating detection terminals including a protruding portion for engaging a complementary recess disposed on the other of the two mating detection terminals, and the other of the two mating detection terminals further including a ride-over portion associated with the recess which causes the protruding portion to deflect during mating of the first and second connector halves together.

14. The low profile connector of claim 13, wherein the mating detection terminal recess and ride-over portion are disposed adjacent each other on the first connector half mating detection terminal and the mating detection terminal protruding portion is disposed on the second connector half.

15. The low profile connector of claim 14, wherein deflection of the mating detection terminal protruding portions occurs sideways as it deflects when it moves across the mating detection terminal ride-over portion.

16. The low profile connector of claim 13, wherein the piezoelectric element indicates successful mating of the first and second connector halves together.

* * * * *